(12) United States Patent
Rhee et al.

(10) Patent No.: US 7,132,306 B1
(45) Date of Patent: Nov. 7, 2006

(54) METHOD OF FORMING AN INTERLEVEL DIELECTRIC LAYER EMPLOYING DIELECTRIC ETCH-BACK PROCESS WITHOUT EXTRA MASK SET

(75) Inventors: Seung-Hyun Rhee, New York, NY (US); Richard J. Huang, Cupertino, CA (US); Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 218 days.

(21) Appl. No.: 10/728,772

(22) Filed: Dec. 8, 2003

(51) Int. Cl.
*H01L 21/00* (2006.01)
*H01L 21/311* (2006.01)
*H01L 21/302* (2006.01)

(52) U.S. Cl. .............. 438/42; 438/702; 438/706; 438/710

(58) Field of Classification Search ............ 438/42, 438/702, 706, 710
See application file for complete search history.

(56) References Cited

U.S. PATENT DOCUMENTS

| | | | | |
|---|---|---|---|---|
| 6,146,986 A | * | 11/2000 | Wagganer | 438/618 |
| 6,303,464 B1 | * | 10/2001 | Gaw et al. | 438/422 |
| 6,413,854 B1 | * | 7/2002 | Uzoh et al. | 438/637 |
| 2005/0007217 A1 | * | 1/2005 | Deligianni et al. | 335/78 |

OTHER PUBLICATIONS

S. Wolf and R.N. Ttauber, Silicon Processing for the VLSI Era, vol. 1- Process Technology, Lattice Press, 1986, p. 183.*
S. Wolf, Silicon Processing for the VLSI Era, vol. 4- Deep Submicron Process Technology, Lattice Press, 2002, p. 654.*
Vincent Arnal et al. "A Novel $SiO_2$-Air Low K for Copper Dual Damascene Interconnect", Conference Proceedings ULSI XVI (2001) Materials Research Society pp. 71-77.
B. Shieh et al., "Air-Gap Formation During IMD Deposition to Lower Interconnect Capacitance", IEEE Electron Device Letters, vol. 19, No. 1, Jan. 1998.
B. P. Shieh et al., "Integration and Reliability Issues for Low Capacitance Air-Gap Interconnect Structures", 1998 IEEE.
Vincent Arnal et al., "Optimization of CVD Dielectric Process to Achieve Reliable Ultra Low-κ Air Gaps", Microelectronic Engineering 60 (2002) pp. 143-148.

* cited by examiner

*Primary Examiner*—Nadine Norton
*Assistant Examiner*—Mahmoud Dahimene

(57) ABSTRACT

A method of forming an interlevel dielectric (ILD) layer forms a polymer sacrificial ILD on a substrate. After metallization structures are formed in the polymer sacrificial ILD layer, a low power etch back is performed on the sacrificial ILD layer.ABSTRACT material is non-conformally deposited as an ILD layer over the substrate and the metallization structures, forming air gaps between some of the metallization structures.

15 Claims, 3 Drawing Sheets

METHOD OF FORMING AN INTERLEVEL DIELECTRIC LAYER EMPLOYING DIELECTRIC ETCH-BACK PROCESS WITHOUT EXTRA MASK SET

FIELD OF THE INVENTION

The present invention relates to the field of semiconductor processing and more particularly, to a method of forming an interlevel dielectric (ILD) layer.

BACKGROUND OF THE INVENTION

One of the major concerns in semiconductor processing, and in particular, to microminiaturization of CMOS technology, is reduction in coupling capacitance between interconnects in order to limit propagation delay and signal faults due to cross-talk. In order to achieve this goal in reducing the cross-talk between lines, low k-dielectric materials have been increasingly investigated for integration into the interconnect level. However, extreme low k materials have been considered to cause serious integration and reliability problems. In response, it has been suggested to create air gaps in the dielectric material between metal lines, since air has the lowest permittivity that can be achieved. This makes the resulting dielectric constant of the insulating layer to be very low. FIGS. 1–3 depict a prior art process for forming air gaps in the dielectric layer of an interconnect level.

In FIG. 1, a sacrificial interlevel dielectric layer 12 is formed on a substrate 10. Substrate 10 can be any underlying layer or layers, such as another metallization level. Within the ILD layer 12 are recesses in which metal lines 14 are formed. For example, the metal lines 14 may be made of copper, either deposited by electroplating or electroless deposition. A barrier layer 16, consisting of titanium nitride or tantalum nitride, for example, lines the recess and prevents contamination of the dielectric layer by diffusion of copper 14. A conventional material for use as a dielectric material is silicon oxide ($SiO_2$).

In order to create air gaps between the metal lines 14 and reduce the dielectric constant k for a metallization level, an etch back process is performed. This involves etching of the silicon oxide of the dielectric layer 12. However, the etching process would undesirably cause the copper at the top of the metal lines 14 to be sputtered during the etching process if left unprotected. The surface of the metal lines 14 would then undesirably roughen, leading to poor connectivity and increased resistance between metallization levels. Hence, an additional mask set is formed and lithography process steps are performed to create photoresist masks 20 that need to be precisely aligned over the metal lines 14.

FIG. 2 depicts the formation of FIG. 1 following the etching back of the dielectric layer 12. An imprecise alignment of the photoresist masks 20 over the metal lines 14 is depicted to illustrate concerns regarding the problems related to exposure of the copper during etching. This includes copper sputtering around during the process and the roughening of the surface of the copper of the metal lines. Part of the cause of the sputtering of the copper is the relatively high power required to break the strong silicon-oxygen bonding required to etch back the silicon oxide of the dielectric layer 12.

FIG. 3 depicts the structure of FIG. 2 at a non-conformal deposition of silicon oxide ($SiO_2$) over the metal lines 14 and the substrate 10. This forms a second dielectric layer 22. In the narrow space between metal lines 14, the non-conformal deposition of the silicon oxide creates air gaps 24 in the second dielectric layer 22. These air gaps reduce the overall dielectric constant of the second dielectric layer 22. The morphology of the air gaps depends upon the aspect ratio of the trenches and on the step coverage of the process used to achieve the non-conformal dielectric deposition.

The conventional process depicted in FIGS. 1–3 has the disadvantage of requiring an extra mask set and additional lithography steps to create the masks that protect the copper at the top of the metal lines 14. Such protection, however, is essential due to the high power needed to etch back the silicon oxide used as the sacrificial material in the first dielectric layer 12. Otherwise, exposure of copper to the etch process caused by even minimal misalignments of the mask would allow sputtering of the copper and roughening of the surface of the metal lines.

SUMMARY OF THE INVENTION

There is a need for a method of forming a metal interconnect level with reduced dielectric constant by a dielectric etch back process, but without employing the extra mask sets and lithography steps used in conventional approaches.

This and other needs are met by embodiments of the present invention which provide a method of forming an interlevel dielectric (ILD) layer comprising the steps of forming a polymer sacrificial ILD on a substrate and forming metallization structures within the polymer sacrificial ILD. An etching back of the polymer sacrificial ILD is performed. This is followed by non-conformally depositing dielectric material as an ILD layer over the substrate and the metallization structures so as to form air gaps in the ILD layer between at least some of the metallization structures.

By employing a polymer sacrificial ILD, a lower power etch back process may be employed to remove this sacrificial ILD and create the recesses between the metalization structures. Hence, the likelihood of copper sputtering from the top of the metal lines is greatly reduced. This can be even further reduced, in certain embodiments of the invention, by the use of a metal cap layer, such as tantalum, over the metallization structures. A maskless process for etching back the sacrificial ILD can be employed in the present invention since the polymer sacrificial ILD has a chemical bonding that is much weaker than the silicon-oxide bonding and the silicon dioxide ($SiO_2$) of conventional processes. This results in simplified manufacturing and reduced costs, as well as improving the accuracy and efficiency of the process.

The earlier stated needs are also met by embodiments of the present invention which provide a method of forming an interconnect structure comprising forming a polymer ILD layer on a substrate and forming metal lines within the polymer ILD layer, these metal lines being capped with a cap layer. The polymer ILD layer is etched back and a second ILD layer is formed on the substrate.

The foregoing and other features, aspects and advantages of the present invention will become more apparent from the following detailed description of the present invention when taken in conjunction with the accompanying drawings.

DETAILED DESCRIPTION OF THE INVENTION

The present invention address and solves problems, at least in part, related to the formation of interconnect structures, including those created by a dielectric etch back process in forming air gaps between metal lines. The present invention avoids the use of an extra mask set and additional lithography steps by employing a polymer sacrificial layer that is etched at a relatively lower power and in conventional methodologies. In certain embodiments, a cap layer is provided over the metal lines. The etch back process can therefore be performed without an extra mask step or additional lithography steps in a self-aligned manner since the polymer sacrificial layer may be removed at a lower power than a conventional silicon oxide layer. This prevents copper sputtering of the top of the metal lines that would cause pitting of the copper lines by the relatively high power required to etch back silicon oxide.

Figure 1:
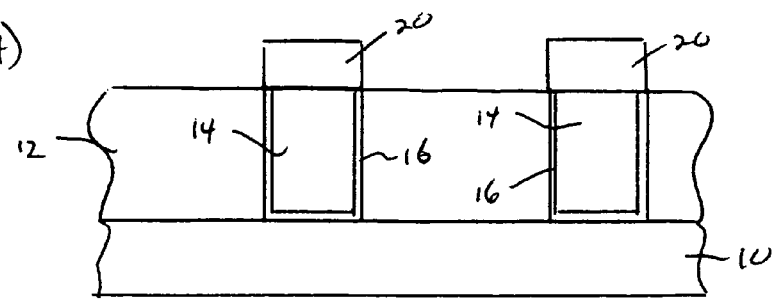
FIGS. 1–3 depict sequential steps in a conventional process for forming air gaps in a dielectric layer between metal lines in an interconnect structure formed in accordance with prior art methodologies.
Figure 2:
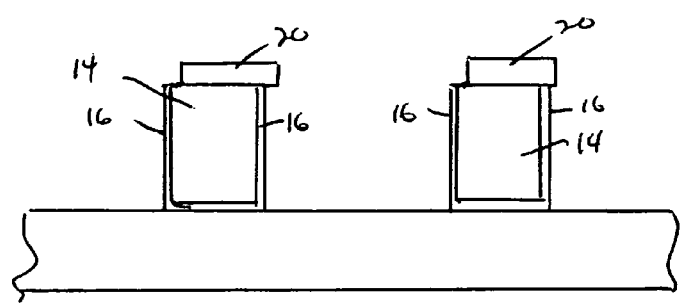
Figure 3:
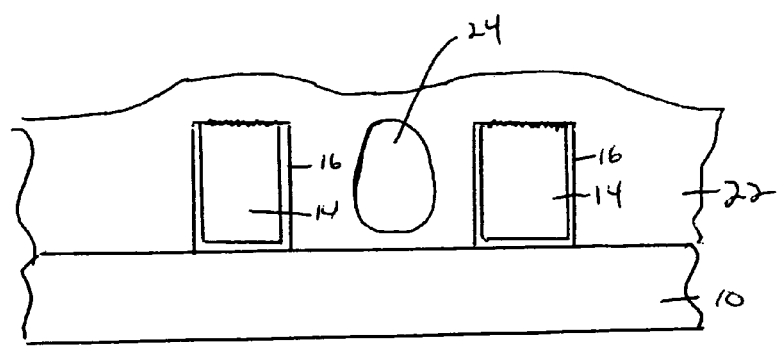
Figure 4:
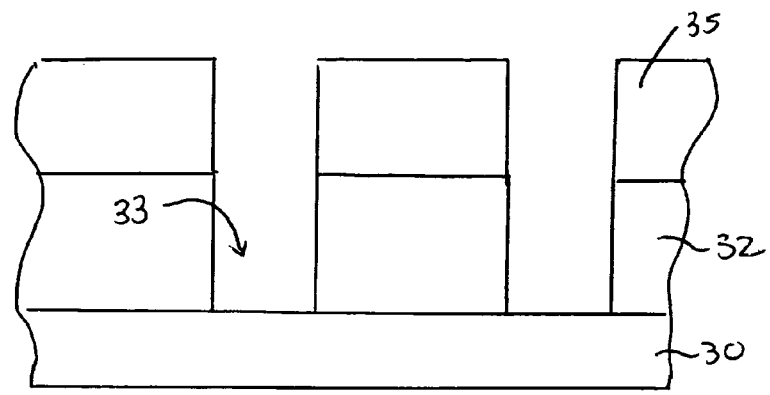
FIGS. 4–9 depict sequential steps of a process for performing an ultra low k dielectric layer for an interconnect level in accordance with methods of the present invention.

FIG. 4 depicts a cross-section of a portion of a semiconductor wafer during formation of an interconnect level in accordance with embodiments of the present invention. A substrate 30, which may be formed with one or more levels, including circuitry, metallization levels, etc., is covered by a sacrificial layer 32. In the embodiments of the invention, sacrificial layer 32 is a polymer sacrificial layer, or polymer ILD layer. Suitable materials for the polymer sacrificial layer 32 may be selected by one of ordinary skill in the art. Other materials include benzocyclobutene (BCB), polyimides and poly-arylene ethers (PAEs). One of the aspects of the polymer sacrificial layer 32 is its ability to be easily etched at low power during an etch back process.

Recesses 33 are formed in the sacrificed layer 32 through a photoresist mask 35 that has been patterned and developed. A photoresist mask is also used in the formation of recesses in the conventional methodology in the creation of metal lines. However, unlike the conventional methodology, an additional mask is not formed to protect the metal lines during the etch back process in the present invention.

Figure 5:
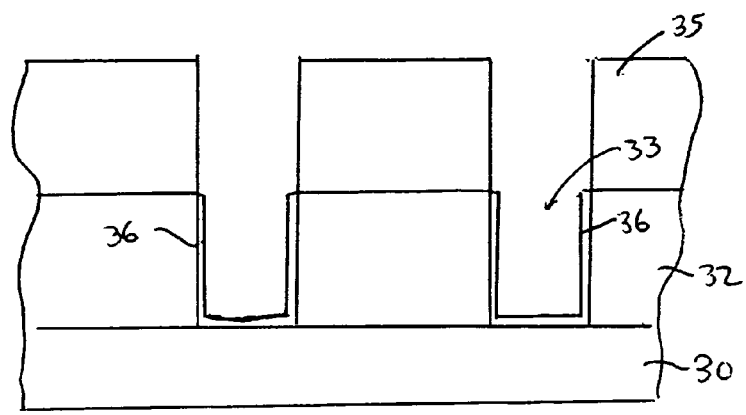

FIG. 5 depicts the structure of FIG. 4 following the deposition of a seed/barrier layer. In certain embodiments of the invention, the layer 36 is simply a barrier layer, and is not a seed layer. In other embodiments, the layer 36 also servers as a seed layer for electrochemical deposition of the metal of the metal line. An example of a suitable barrier layer is titanium nitride, tantalum, tantalum nitride, etc., as well as a Ta/TaN bi-layer.

Following the formation of the barrier layer 36, metal 38 is deposited, either electrolessly or electrochemically. A suitable material is copper, and is designated by numeral 38 in FIG. 6.

Figure 6:
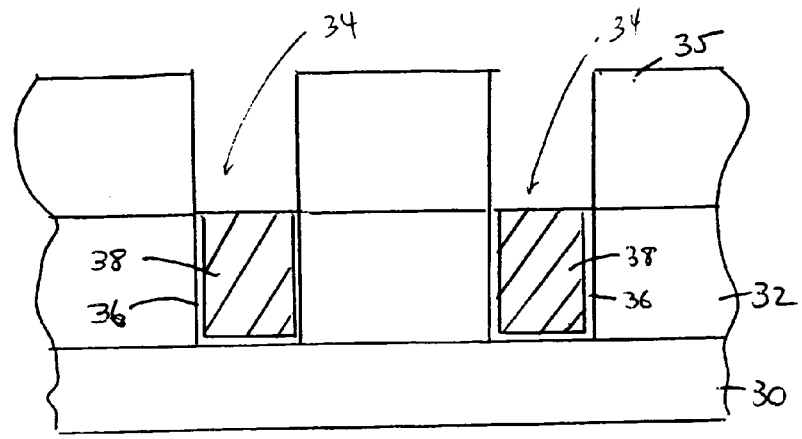
Figure 7:
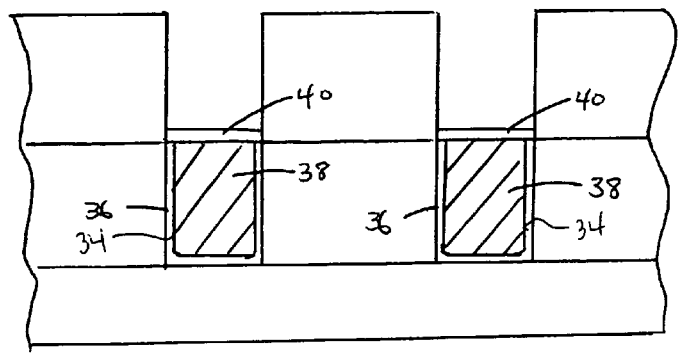

FIG. 7 depicts the structure of FIG. 6 after a metal cap layer 40 is deposited on the top of the copper 38. In certain embodiments of the invention, the metal cap layer 40 is made of a material that has a much greater atomic mass than that of copper 38. For example, tantalum has an atomic mass of 2.848 times that of copper. This makes the metal cap layer 40 more resistant to the etch back process to reduce the sputtering and surface roughening of the cap layer 40, especially in comparison to that of copper.

Figure 8:
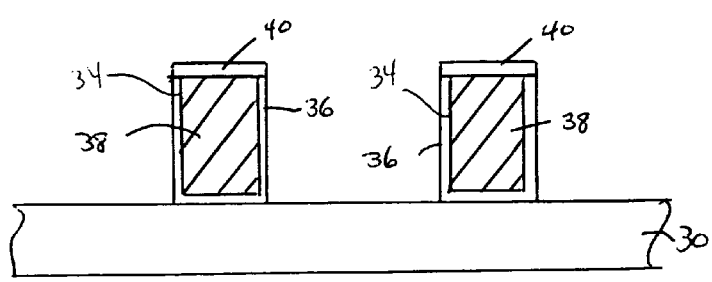

In FIG. 8, the photoresist 35 has been removed from the polymer sacrificial layer 32. An etch back process is then performed to etch back the polymer sacrificial layer 32. During this etching back, the tantalum (or other metal) of the metal cap layer 40, protects the copper surface of the copper 38 of the metal line 34. Due to the use of a polymer sacrificial layer 32, a lower power etch back process may be employed. Conventional etch recipes may be employed.

In addition to the lower power etch back process of the invention, the metal cap layer 40 made of tantalum, for example, has an atomic mass that is much greater than that of copper so that the sputtering and surface roughening of the metal cap layer will be much reduced. The lower power etch back process, as well as the use of the metal cap layer 40, obviates the need for providing a photoresist material or other mask above the metal lines 34 during the etch back process. This reduces the number of masks and additional lithography steps that otherwise need to be taken, thereby reducing costs and increasing manufacturing efficiency. The deposition of metal cap layer 40, as shown in FIG. 7, is a self-aligned process, and thus provides accuracy to protect Cu from being exposed in etching back process.

Figure 9:
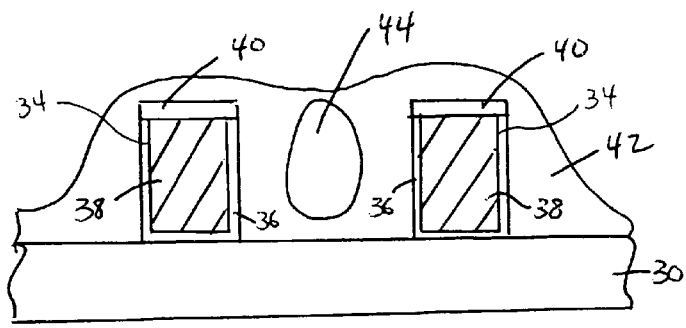

Once the etch back process is complete, as depicted in FIG. 8, a non-conformal deposition of dielectric material may then be performed, the results of which are depicted in FIG. 9. A second dielectric layer, or second ILD layer 42, is formed. A non-conformal deposition of the second ILD layer 42 creates an air gap 44 between certain metal lines 34. This lowers the dielectric constant of the second ILD layer 42 to an ultra low value. This embodiment employs silicon oxide ($SiO_2$) as an exemplary dielectric material. In other embodiments of the invention, an ultra low k dielectric with otherwise poor mechanical/etching properties is employed to fill the gap between the metal lines 34. This embodiment is not depicted, but can be readily understood by those of ordinary skill in the art. The only difference between FIG. 9 and the use of an ultra low k material that fills the gap is the elimination of the air gap 44.

The present invention thus provides a method for etching back a dielectric material without an extra mask set, and employs a polymer sacrificial dielectric material as well as a metal cap layer, in certain embodiments. Reduced costs, increased manufacturing efficiency, as well as improved accuracy are provided by embodiments of the invention.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming an interlevel dielectric (ILD) layer, comprising the steps of:
    forming a polymer sacrificial ILD on a substrate;
    forming a photomask on the polymer sacrificial ILD;
    etching recesses in the polymer sacrificial ILD through the photomask;
    forming metallization structures within the polymer sacrificial ILD while the photomask is on the polymer sacrificial ILD, including depositing copper within the recesses in the polymer sacrificial ILD, and forming a metal cap layer on the copper deposited within the recesses;
    etching back the polymer sacrificial ILD;
    non-conformally depositing dielectric material as an ILD layer over the substrate and the metallization structures so as to form air gaps in the ILD layer between at least some of the metallization structures.

2. The method of claim 1, wherein the etching back of the polymer sacrificial ILD is performed while the cap layer is exposed to the etching back process, the cap layer preventing etching of the copper.

3. The method of claim 2, wherein the cap layer is Ta.

4. The method of claim 3, wherein the polymer sacrificial ILD is a poly-arylene ether.

5. The method of claim 4, wherein the dielectric material of the ILD layer is $SiO_2$ or SiOF.

6. The method of claim 1, wherein the etching back of the polymer sacrificial ILD is a maskless etching back.

7. The method of claim 1, wherein the etching back of the polymer sacrificial ILD is a self-aligned process.

8. The method of claim 4, wherein the dielectric material of the ILD layer is an ultra low k dielectric layer having a dielectric constant less than 2.5.

9. A method of forming an interconnect structure, comprising the steps of:
   forming a polymer interlayer dielectric (ILD) layer on a substrate;
   forming a photomask on the polymer ILD layer;
   etching recesses in the polymer ILD layer through the photomask;
   forming metal lines within the polymer ILD layer, the metal lines being capped with a cap layer while the photomask is on the polymer ILD layer;
   removing the photomask;
   etching back the polymer ILD layer; and
   forming a second ILD layer on the substrate.

10. The method of claim 9, wherein the step of forming a second ILD layer includes non-conformally depositing dielectric material over the metal lines and the substrate, the non-conformally depositing forming air gaps in the dielectric material between at least some of the metal lines.

11. The method of claim 10, wherein the metal lines comprise copper and the cap layer comprises tantalum.

12. The method of claim 9, wherein the step of forming a second ILD layer includes depositing ultra low k dielectric material on the substrate and between the metal lines.

13. The method of claim 12, wherein the metal lines comprise copper and the cap layer comprises tantalum.

14. The method of claim 9, wherein the etching back of the polymer ILD layer is a maskless etching, with a top surface of the cap layer and the polymer ILD layer being free of mask material.

15. The method of claim 14, wherein the metal lines comprise copper and the cap layer comprises tantalum.

* * * * *